United States Patent
Yamagami et al.

(10) Patent No.: US 12,262,491 B2
(45) Date of Patent: Mar. 25, 2025

(54) DISPLAY APPARATUS

(71) Applicant: DENSO TEN Limited, Kobe (JP)

(72) Inventors: Yuta Yamagami, Kobe (JP); Daisuke Onojima, Kobe (JP)

(73) Assignee: DENSO TEN Limited, Kobe (JP)

(*) Notice: Subject to any disclaimer, the term of this patent is extended or adjusted under 35 U.S.C. 154(b) by 180 days.

(21) Appl. No.: 18/147,896

(22) Filed: Dec. 29, 2022

(65) Prior Publication Data
US 2023/0301001 A1   Sep. 21, 2023

(30) Foreign Application Priority Data

Mar. 18, 2022  (JP) ................. 2022-044370

(51) Int. Cl.
*H05K 5/02* (2006.01)
*B60R 11/00* (2006.01)
*B60R 11/02* (2006.01)

(52) U.S. Cl.
CPC ........ *H05K 5/0217* (2013.01); *B60R 11/0235* (2013.01); *B60R 2011/0005* (2013.01)

(58) Field of Classification Search
CPC ............. H05K 5/0217; B60R 11/0235; B60R 2011/0005
See application file for complete search history.

(56) References Cited

U.S. PATENT DOCUMENTS

| | | | | |
|---|---|---|---|---|
| 5,986,726 A * | 11/1999 | Murai | ............... | G02F 1/133308 349/59 |
| 2010/0231821 A1* | 9/2010 | Tsuji | ................. | G02F 1/133308 361/679.01 |
| 2013/0155717 A1* | 6/2013 | Jeong | ................ | G02F 1/133308 362/602 |
| 2022/0177042 A1* | 6/2022 | Yonezawa | .............. | B62D 25/14 |
| 2022/0340756 A1* | 10/2022 | Nishijima | ............... | B32B 15/09 |

FOREIGN PATENT DOCUMENTS

| | | |
|---|---|---|
| JP | 2009-288671 A | 12/2009 |
| JP | 2010-237474 A | 10/2010 |

* cited by examiner

*Primary Examiner* — Abhishek M Rathod
*Assistant Examiner* — Keon Kim
(74) *Attorney, Agent, or Firm* — Oliff PLC

(57) ABSTRACT

A display apparatus includes a display panel, a frame, and a bracket. The frame surrounds an outer circumference of the display panel in a planar view in which the display apparatus is viewed in a direction orthogonal to a plane of the display panel. The bracket holds the display panel from a back side of the display panel and extends outside the outer circumference of the display panel in the planar view. The bracket (i) has a bending portion that extends toward a front side of the display panel outside the outer circumference of the display panel in the planar view, (ii) supports the frame from a back side of the frame by the bending portion and (iii) has a projection in the bending portion that holds a lateral surface of the display panel.

7 Claims, 6 Drawing Sheets

DISPLAY APPARATUS

BACKGROUND OF THE INVENTION

Field of the Invention

The invention relates to a display apparatus.

Description of the Background Art

Conventionally, for example, when a display apparatus, such as a navigation apparatus mounted on a vehicle, is arranged on a front side of a vehicle cabin, there is a technology capable of securing a sufficient strength against an impact.

However, in the conventional technology, there is a room for improvement in reducing a breakage of the display apparatus when the impact is applied.

SUMMARY OF THE INVENTION

According to one aspect of the invention, a display apparatus includes a display panel, a frame, and a bracket. The frame surrounds an outer circumference of the display panel in a planar view in which the display apparatus is viewed in a direction orthogonal to a plane of the display panel. The bracket holds the display panel from a back side of the display panel and extends outside the outer circumference of the display panel in the planar view. The bracket (i) has a bending portion that extends toward a front side of the display panel outside the outer circumference of the display panel in the planar view, (ii) supports the frame from a back side of the frame by the bending portion and (iii) has a projection in the bending portion that holds a lateral surface of the display panel.

It is an object of the invention to provide a display apparatus capable of reducing a breakage of the display apparatus when an impact is applied.

These and other objects, features, aspects and advantages of the invention will become more apparent from the following detailed description of the invention when taken in conjunction with the accompanying drawings.

DESCRIPTION OF THE EMBODIMENTS

A display apparatus according to an embodiment will be described below in detail with reference to the accompanying drawings. In addition, this invention is not limited to the embodiment described below.

First, an outline of the display apparatus according to the embodiment will be described with reference to FIG. 1. A display apparatus 1 is, for example, a display apparatus, such as a navigation apparatus mounted on a vehicle, and is arranged on a center cluster that is a central part of a front side of a vehicle cabin.

Figure 1:
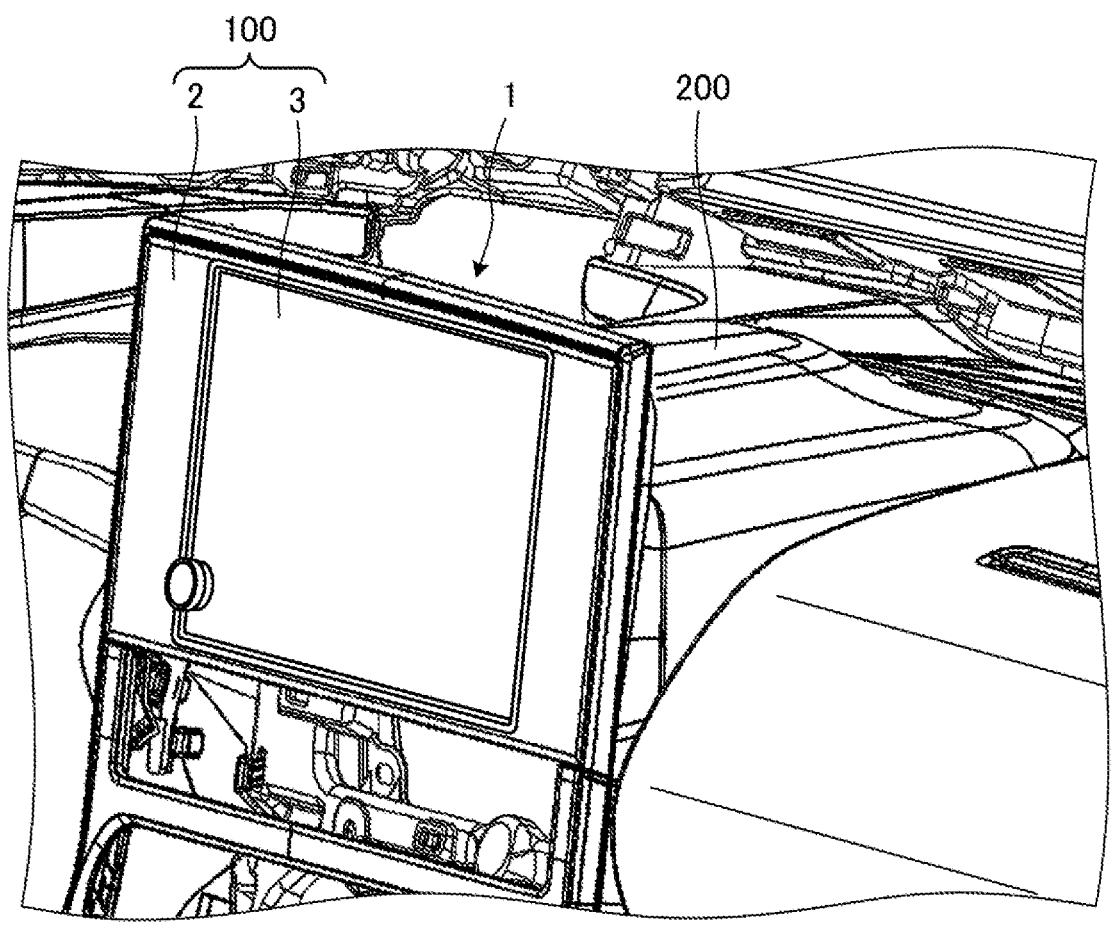
FIG. 1 is a diagram illustrating an outline of a display apparatus according to an embodiment.

As illustrated in FIG. 1, the display apparatus 1 includes a front panel 100 that is a display surface on which information is displayed. In an example illustrated in FIG. 1, an upper end of the front panel 100 protrudes from a dashboard 200 in which the front panel 100 is installed.

Furthermore, the front panel 100 is constituted of a frame 2 and a display panel 3. The frame 2 and the display panel 3 are arranged to have a positional relation that a front surface of the frame 2 and a front surface of the display panel 3 are on a same plane, or the front surface of the display panel 3 is retreated to a back side of the display panel 3 by a predetermined distance d (e.g., 0>d>3 mm) from the front surface of the frame 2. In this disclosure, a case in which the front panel 100 is viewed from a front side (a case in which the vehicle cabin is viewed from a rear side to the front side) may be referred to as "a planar view".

The frame 2 is arranged to surround a periphery of the display panel 3 in the planar view so as to accommodate the display panel 3 and functions as a bezel of the front panel 100. The frame 2 is, for example, made of a resin material.

In FIG. 1, in the frame 2 that surrounds four sides of the display panel 3, an upper end and a lower end of the frame 2 have bezel widths narrower than those of a right end and a left end of the frame 2. However, the upper end and the lower end of the frame 2 may have bezel widths wider than those of the right end and the left end of the frame 2. All of the upper end, the lower end, the right end and the left end may have a same bezel width.

The display panel 3 functions as a display surface in the front panel 100. A glass panel member 32 (refer to FIG. 3) is arranged on the front surface of the display panel 3. Although details will be described later, the display panel 3 has a display element 31 (refer to FIG. 3), a resin member 33, and the like, besides the panel member 32 (refer to FIG. 3).

Here, conventionally, when an object collides with a frame of a front panel, the frame is pushed to a back side so that an end of a glass panel member may protrude forward from a front surface of the frame. As a result, the object hits the end of the panel member directly so that the panel member may be damaged.

Therefore, in this disclosure, since the frame 2 and the display panel 3 are held by a bracket 4 (refer to FIG. 2), a breakage of the display apparatus 1 is reduced when an impact is applied.

Figure 2:
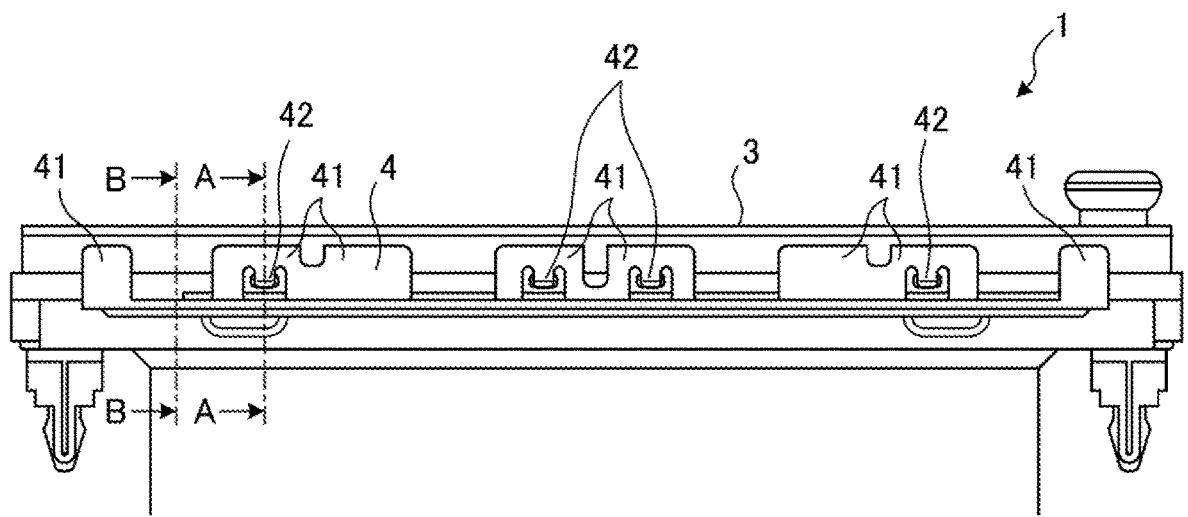
FIG. 2 illustrates the display apparatus in a top view.
Figure 3:
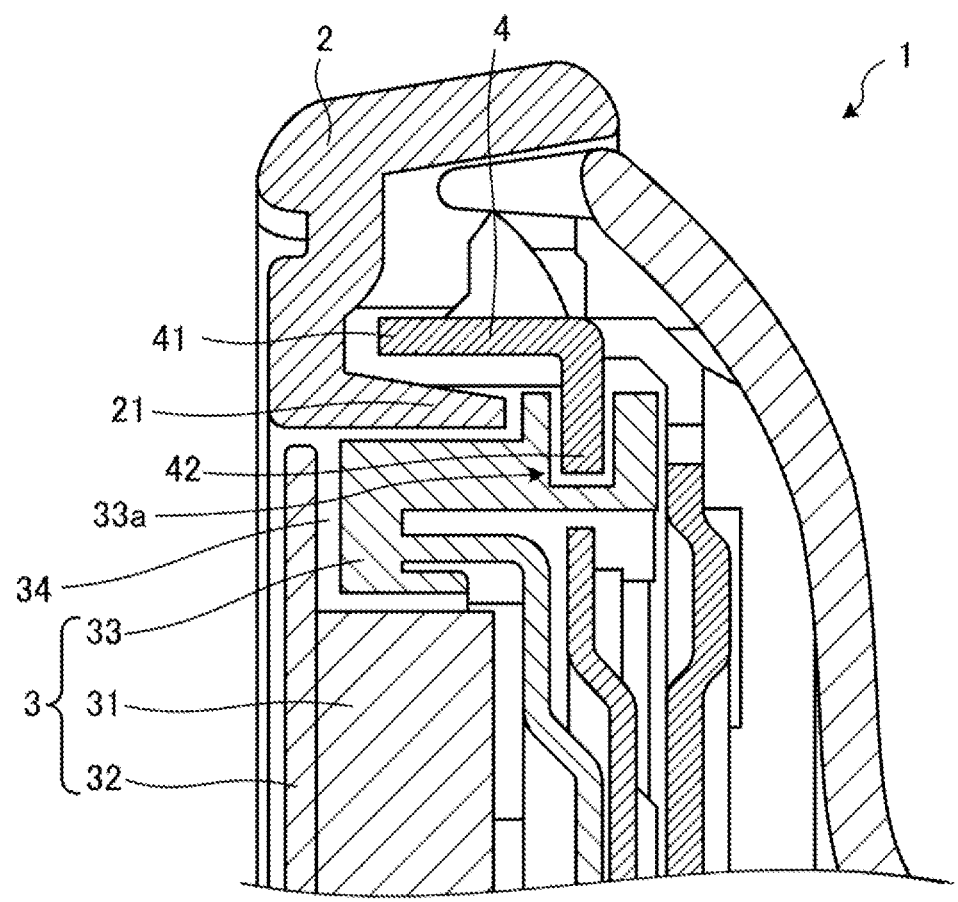
FIG. 3 is a cross section of the display apparatus.
Figure 4:
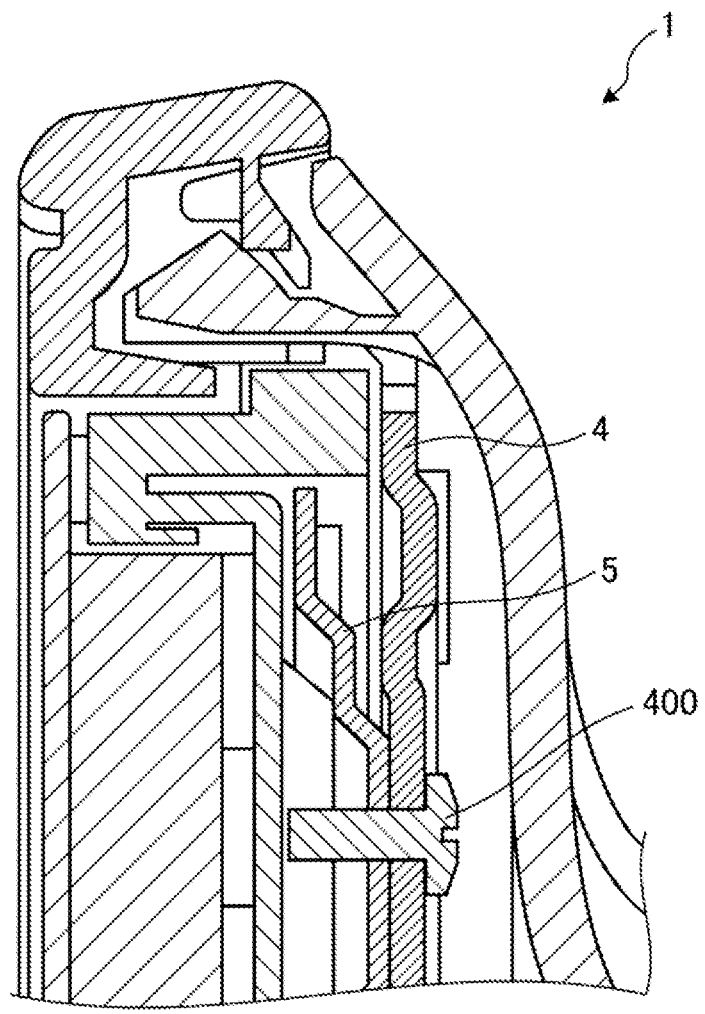
FIG. 4 is a cross section of the display apparatus.

Details of the bracket 4 will be described below with reference to FIG. 2 and the following figures. FIG. 2 illustrates the display apparatus 1 in a top view. Each of FIG. 3 and FIG. 4 is a cross section of the display apparatus 1. FIG. 2 illustrates the display apparatus 1 in the top view in which the frame 2 is abbreviated. FIG. 3 is the cross section taken along a line A-A in FIG. 2. FIG. 4 is the cross section taken along a line B-B in FIG. 2.

As illustrated in FIG. 2 to FIG. 4, the bracket 4 extends outside the display panel 3 in a planar view. The bracket 4 has a bending portion that extends toward a front side of the display panel 3 outside an outer circumference of the display panel 3 in the planar view and supports the frame 2 from a back side of the frame by the bending portion.

Specifically, as illustrated in FIG. 3, the bracket 4 extends to a side of the upper end of the display panel 3. Since the bracket 4 is bent toward the front side of display panel 3 at the upper end, the bracket 4 enters into the frame 2. That is, the bracket 4 extends to the side of the upper end of the display panel 3, has the bending portion that is bent toward the front side of the display panel 3 at the upper end, and supports an upper side (bezel at the upper end) of the frame 2 from the back side of the frame.

More specifically, an end 21 of the frame 2 on a side of the display panel 3 is bent from the front side to the back side of the display panel 3. That is, the frame 2 is formed in an approximately C-shape in which the frame 2 is recessed on the back side in a cross-sectional view.

A first end 41 of the bracket 4 is arranged to enter into a position in which the frame 2 having the C-shape is recessed. In other words, the first end 41 of the bracket 4 is arranged to sandwich the end 21 of the frame 2 between the first end 41 of the bracket 4 and the display panel 3.

The first end 41 of the bracket 4 and the frame 2 are arranged with a gap therebetween and the first end 41 of the bracket 4 supports the frame 2 when an impact is applied to the frame 2. That is, the bracket 4 supports the frame 2 when the impact is applied.

As a result, even when an object collides with a front side of the frame 2, since a move in an upward direction of the end 21 of the frame 2 is regulated by the first end 41 of the bracket 4, the frame 2 is suppressed from coming away from the display apparatus 1. In addition, actions and effects of the bracket 4 when the impact is applied will be described later in detail with reference to FIG. 6.

The bracket 4 has a second end 42 (one example of projections) in the bending portion described above that holds a lateral surface of the display panel 3. Specifically, the bracket 4 holds the display panel 3 from an upper lateral surface that is the lateral surface on the upper end of the display panel 3.

Figure 5:
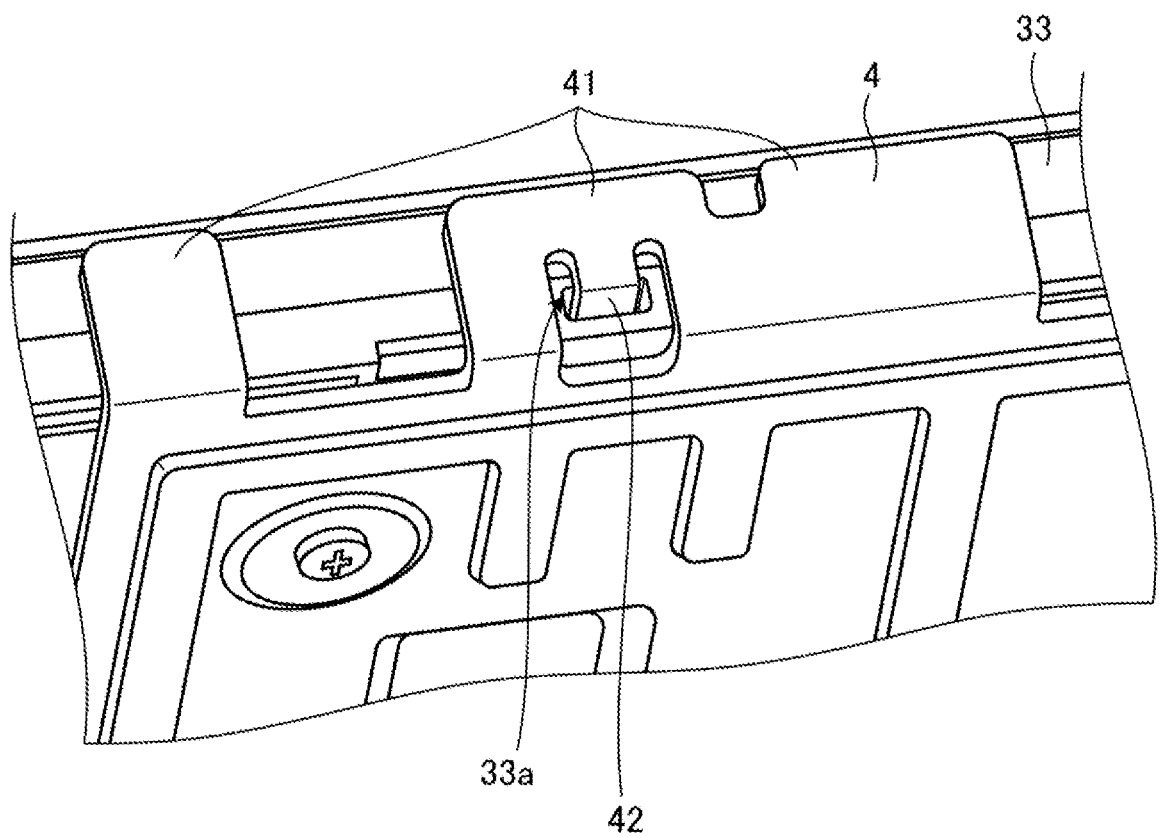
FIG. 5 is an enlarged view of a bracket.

FIG. 5 is an enlarged view of the bracket 4. As illustrated in FIG. 5, a recess 33a is provided on the upper lateral surface of the display panel 3, and the bracket 4 holds the display panel 3 by a distal end of the second end 42 as a projection being fitted into the recess 33a.

Here, the display panel 3 has a display element 31, a panel member 32 that covers a display surface as a main surface of the display element, and the resin member 33 that is arranged on a lateral surface of the display element 31 and is provided with the recess 33a (refer to FIG. 3).

For the display element, optional flat display elements such as a liquid crystal display (LCD) element, a plasma display panel (PDP) element, an organic EL display (OLED) element are used.

That is, since the second end 42 of the bracket 4 is fitted into the recess 33a provided in the resin member 33, the display panel 3 is held. The resin member 33 is fixed to a back surface of the panel member 32 by a fixing member 34. The fixing member 34 is, for example, an adhesive member such as a double-sided adhesive tape.

Thus, when an object collides with the front side of the frame 2, the second end 42 of the bracket 4 pulls the panel member 32 via the recess 33a of the resin member 33. As a result, the display panel 3 is pulled to the back side at the same time that the frame 2 is pushed to the back side by the object.

Thus, since the display panel 3 and the frame 2 are moved to the back side (deformed) in a state of keeping the positional relation, it is possible to prevent the frame 2 from being misaligned from the panel member 32 and further prevent an end of the panel member 32 from protruding forward from the front surface of the frame 2.

That is, it is possible to prevent the end of the panel member 32 from hitting the object directly and reduce the breakage of the panel member 32. These actions and effects will be described later in detail with reference to FIG. 6.

Furthermore, as illustrated in FIG. 4, the bracket 4 is fixed to a sheet metal chassis 5 constituting a back surface of the display panel 3. Specifically, the bracket 4 is arranged on a back side of the sheet metal chassis 5 and is fixed by a fastening tool 400 such as a screw As a result, when an object collides with the front side of the frame 2, the display panel 3 is also pushed by the sheet metal chassis 5 from the back side of the sheet metal chassis 5 in addition to the second end 42 of the bracket 4.

As illustrated in FIG. 2, the bracket 4 holds the lateral surface of the display panel 3 at a plurality of positions. In an example shown in FIG. 2, the bracket 4 holds the upper lateral surface of the display panel 3 by four second ends 42.

As a result, since loads due to the impact applied to the four second ends 42 are dispersed to the plurality of positions, the four second ends 42 are prevented from being damaged and not functioning due to the impact.

As illustrated in FIG. 2, in the bracket 4, a plurality of first ends 41 are located at a plurality of positions. That is, the bracket 4 is located outside the outer circumference of the display panel 3 in the planar view at the plurality of positions, and the bending portion extends toward the front side of the display panel at the plurality of positions.

As a result, since the loads due to the impact applied to the plurality of the first ends 41 are dispersed to the plurality of the positions, the plurality of the first ends 41 are prevented from being damaged and not functioning due to the impact.

Figure 6:
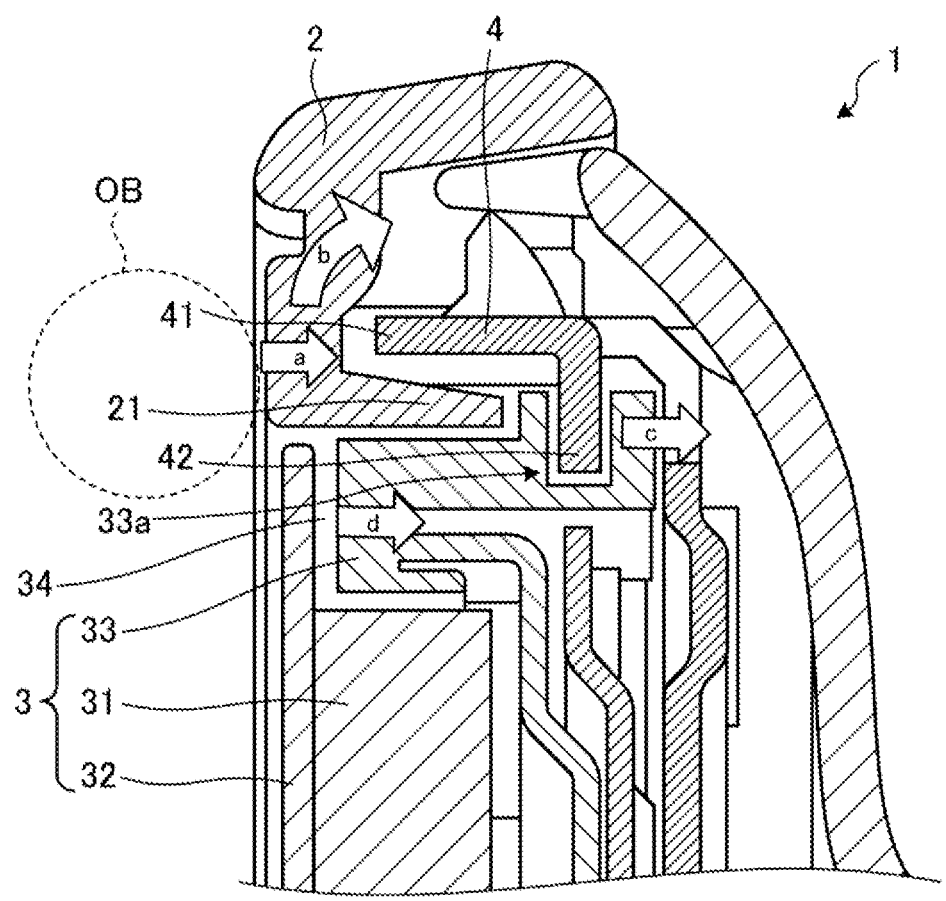
FIG. 6 is a diagram for explaining actions and effects of the bracket.

Next, the actions and effects of the bracket 4 will be described with reference to FIG. 6. FIG. 6 is a diagram for explaining the actions and effects of the bracket 4. FIG. 6 illustrates an example in which an object OB collides with the frame 2 near the display panel 3 at the upper end of the front panel 100.

As illustrated in FIG. 6, when the object OB collides with the frame 2 near the display panel 3, a force associated with the impact is generated in a direction (arrow a) from the front side to the back side. Accordingly, a force acting upwardly (arrow b) acts against the frame 2. That is, the force is generated in a direction that the frame 2 is separated from the panel member 32.

In this case, the bracket 4 restricts the frame 2 from moving in the direction (direction on a page shown in FIG. 6) that the frame 2 is separated from the panel member 32. Specifically, the first end 41 of the bracket 4 restricts the end 21 of the frame 2 from moving in the direction that the end 21 of the frame 2 is separated from the panel member 32.

As a result, since the frame 2 is prevented from being separated from the display panel 3, the end of the panel member 32 is prevented from protruding forward from the front surface of the frame 2 and thus hitting the object OB directly. Thus, the panel member 32 is prevented from being damaged.

Particularly, in a structure in which the upper end of the display apparatus 1 (front panel 100) protrudes from the dashboard 200, it is not easy to reinforce the frame 2 at the upper end by taking into consideration the design. Thus, by using the bracket 4, it is possible to effectively reduce the breakage of the display apparatus 1 due to the impact while securing the design.

A force associated with the impact of the object OB is generated in the direction (arrow a) from the front side to a back side of the frame 2. That is, the frame 2 is pushed in a backward direction. In this case, a force from the front side to the back side is generated with respect to the bracket 4. As a result, the second end 42 of the bracket 4 pushes the recess 33a of the resin member 33 in a direction from the front side to the back side (arrow c).

Thus, the panel member 32 fixed to the resin member 33 is pulled from the front side to the back side (arrow d). That is, when the object OB collides with the frame 2, as the frame 2 is pushed to the back side, the display panel 3 is also pulled from the front side to the back side.

That is, since the frame 2 and the display panel 3 are moved to the back side (deformed) in the state of keeping the positional relation, the frame 2 is prevented from being separated from the display panel 3, and the end of the panel member 32 is prevented from protruding forward from the front surface of the frame 2. As a result, it is possible to prevent the end of the panel member 32 from hitting the object OB directly and reduce the breakage of the panel member 32.

As described above, the display apparatus 1 according to the embodiment includes the display panel 3, the frame 2, and the bracket 4. The frame 2 is provided to surround the periphery of the display panel 3 in the planar view so as to accommodate the display panel 3. The frame 2 constitutes the front panel 100 with the display panel 3. The bracket 4 holds the display panel 3 from the back side of the display panel 3 and extends outside the outer circumference of the display panel 3 in the planar view. The bracket 4 has the bending portion that extends toward the front side of the display panel 3 outside the outer circumference of the display panel 3 in the planar view and supports the frame 2 from the back side of the frame by the bending portion. The bracket 4 also has the projection (second end 42) in the bending portion described above that holds the lateral surface of the display panel 3. As a result, it is possible to reduce the breakage of the display apparatus 1 when the impact is applied.

It is possible for a person skilled in the art to easily come up with more effects and modifications. Thus, a broader modification of this invention is not limited to specific description and typical embodiments described and expressed above. Therefore, various modifications are possible without departing from the general spirit and scope of the invention defined by claims attached and equivalents thereof.

While the invention has been shown and described in detail, the foregoing description is in all aspects illustrative and not restrictive. It is therefore understood that numerous other modifications and variations can be devised without departing from the scope of the invention.

What is claimed is:

1. A display apparatus comprising:
   a display panel having a front-most surface with an outer periphery;
   a frame that surrounds and is spaced from the outer periphery of the front-most surface of the display panel in a planar view in which the display apparatus is viewed in a direction orthogonal to a plane of the display panel so that the frame is movable relative to the display panel, the frame including
   (1) a front-most wall having an inner periphery and an outer periphery that is larger than the inner periphery, the inner periphery of the front-most wall being larger than the outer periphery of the front-most surface of the display panel so that the inner periphery of the front-most wall is spaced from the outer periphery of the front-most surface of the display panel,
   (2) an inner wall that extends rearwardly from the inner periphery of the front-most wall, and
   (3) an outer wall that extends rearwardly from the outer periphery of the front-most wall,
   the front-most wall, the inner wall and the outer wall of the frame forming a C-shaped cross-section of the frame in the direction orthogonal to the plane of the display panel, so that a recess is formed rearwardly of the front-most wall between the inner wall and the outer wall of the frame; and
   a bracket that holds the display panel from a back side of the display panel and extends outside the outer periphery of the front-most surface of the display panel and outside an outer circumference of the display panel in the planar view, wherein
   the bracket (i) has a bending portion that (ia) extends toward a front side of the display panel outside the outer circumference of the display panel in the planar view, (ib) extends into the recess between the inner wall and the outer wall of the frame, and (ic) has a front-most end that is spaced by a gap from a rear surface of the front-most wall of the frame, (ii) supports the frame from a back side of the frame by the front-most end of the bending portion coming into contact with the rear surface of the front-most wall of the frame when an impact force in a rearward direction of the display apparatus is applied to the frame, and (iii) has an inwardly extending projection in the bending portion that holds a lateral surface of the display panel.

2. The display apparatus according to claim 1, wherein a second recess is provided in the lateral surface of the display panel, and the bracket holds the display panel by a distal end of the inwardly extending projection being fitted into the second recess.

3. The display apparatus according to claim 2, wherein the display panel includes a display element, a panel member having the front-most surface and that covers a display surface as a main surface of the display element, and a resin member that is arranged on a lateral surface of the display element and is provided with the second recess, wherein the resin member is fixed to a back surface of the panel member.

4. The display apparatus according to claim 1, wherein an upper end of the display apparatus protrudes from a dashboard of a vehicle in which the display apparatus is installed, the bracket extends to a side of the upper end of the display apparatus, has the bending portion that is bent toward the front side of the display panel at the upper end, and supports an upper side of the frame from the back side of the frame, and the projection holds the display panel from an upper lateral surface that is a lateral surface on the upper end of the display panel.

5. The display apparatus according to claim 1, wherein the bracket holds the lateral surface of the display panel at a plurality of positions.

6. The display apparatus according to claim 1, wherein the bracket is located outside the outer circumference of the display panel in the planar view at a plurality of positions, and the bending portion extends toward the front side of the display panel at the plurality of positions.

7. The display apparatus according to claim 1, wherein the bracket is fixed to a sheet metal chassis constituting a back surface of the display panel.

* * * * *